US00RE41368E

(19) United States
(12) Reissued Patent
Uemoto et al.

(10) Patent Number: US RE41,368 E
(45) Date of Reissued Patent: Jun. 8, 2010

(54) HIGH VOLTAGE SOI SEMICONDUCTOR DEVICE

(75) Inventors: Yasuhiro Uemoto, Otsu (JP); Katsushige Yamashita, Hirakata (JP); Takashi Miura, Kyoto (JP)

(73) Assignee: Panasonic Corporation, Osaka (JP)

(21) Appl. No.: 11/076,585

(22) Filed: Mar. 9, 2005

Related U.S. Patent Documents

Reissue of:
(64) Patent No.: 6,531,738
Issued: Mar. 11, 2003
Appl. No.: 09/651,759
Filed: Aug. 30, 2000

(30) Foreign Application Priority Data

Aug. 31, 1999 (JP) ..... 11-246252

(51) Int. Cl.
*H01L 31/0392* (2006.01)

(52) U.S. Cl. ..... 257/347; 257/E29.273; 257/348; 257/349; 257/350; 257/506

(58) Field of Classification Search ..... 257/347–350, 257/506, 510, E29.273, 192
See application file for complete search history.

(56) References Cited

U.S. PATENT DOCUMENTS 5,241,210 A * 8/1993 Nakagawa et al.
5,294,825 A * 3/1994 Nakagawa et al.
5,343,067 A * 8/1994 Nakagawa et al.
5,378,920 A 1/1995 Nakagawa et al.
5,434,444 A * 7/1995 Nakagawa et al.
5,438,220 A * 8/1995 Nakagawa et al.
5,536,961 A * 7/1996 Nakagawa et al.
5,592,014 A * 1/1997 Funaki et al.
5,640,040 A * 6/1997 Nakagawa et al.
5,770,881 A * 6/1998 Pelella et al. ..... 257/347
6,150,697 A * 11/2000 Teshigahara et al. ..... 257/347
6,222,234 B1 * 4/2001 Imai ..... 257/347
6,268,630 B1 * 7/2001 Schwank et al. ..... 257/347
6,278,156 B1 * 8/2001 Kobayashi ..... 257/347
6,439,514 B1 * 8/2002 Yamaguchi et al. ..... 257/500
6,448,614 B2 * 9/2002 Kubo et al. ..... 257/347
6,486,513 B1 * 11/2002 Matsumoto et al. ..... 257/347
6,605,843 B1 * 8/2003 Krivokapic et al. ..... 257/347
6,627,954 B1 * 9/2003 Seefeldt ..... 257/350

FOREIGN PATENT DOCUMENTS

DE 3806164 * 9/1988
EP 497577 * 8/1992
JP 60-030168 2/1985
JP 01-103851 4/1989
JP 1103851 * 4/1989
JP 05-291574 11/1993
JP 2878689 * 1/1999
JP 2896141 5/1999

* cited by examiner

*Primary Examiner*—Nathan W Ha

(57) ABSTRACT

In an SOI (Silicon On Insulator) semiconductor device, a first semiconductor layer overlies a semiconductor substrate so as to sandwich an insulating layer, and second and third semiconductor layers with a different conductivity type from the second semiconductor layer are formed on the surface of the first semiconductor layer. At the interface between the first semiconductor layer and the insulating layer, a fourth semiconductor layer with a different conductivity type from the first semiconductor layer is formed. The fourth semiconductor layer includes an impurity of larger than $3\times10^{12}/cm^2$ so as not to be completely depleted even though a reverse bias voltage is applied between the second and third semiconductor layers.

20 Claims, 9 Drawing Sheets

HIGH VOLTAGE SOI SEMICONDUCTOR DEVICE

Matter enclosed in heavy brackets [ ] appears in the original patent but forms no part of this reissue specification; matter printed in italics indicates the additions made by reissue.

BACKGROUND OF THE INVENTION (1)Field of the Invention

The present invention relates to an SOI (Silicon On Insulator) semiconductor device, and especially relates to a technology of improving the operating voltage of the SOI semiconductor device.

(2)Related Art

In order to electrically separate the semiconductor elements in a semiconductor integrated circuit, the dielectric isolation is often used. In the dielectric isolation, insulating layers are formed at the bottom and on the side of the semiconductor layer, which is the active layer of the semiconductor device. In this specification, this structure is referred to "dielectric isolation structure".

The SOI semiconductor device with the dielectric isolation structure solves problems facing the conventional semiconductor device using the pn junction isolation, i.e., leakage current via the pn junction and unexpected bipolar effects. The SOI semiconductor device with the dielectric isolation structure is effectively used as the high voltage semiconductor device and the semiconductor device for analog switch.

The conventional SOI semiconductor device is disclosed in Japanese Patent Nos. 2896141 and 2878689.

Each of FIGS. 1 and 2 shows the structure of an n-type high voltage MOS (Metal Oxide Semiconductor) transistor as an example of the conventional SOI semiconductor device. An n-type high voltage MOS transistor 100 in FIG. 1 is manufactured as follows. A silicon dioxide film 102 is formed on a main surface of a semiconductor substrate 101, which is a supporting substrate of the SOI substrate. Then, an $n^-$-type semiconductor layer 103, which is to be the active layer of the SOI substrate, overlies the silicon dioxide film 102. An isolation trench 104 extending to the silicon dioxide film 102 is formed on the $n^-$-type semiconductor layer 103 by etching so as not to be affected by the potentials of the adjacent semiconductor elements. On the side walls of the isolation trench 104, silicon dioxide films 105 are formed. The isolation trench 104 is filled with polysilicon 106. As a result, the $n^-$-type semiconductor layer 103 is electrically isolated from the other semiconductor island. More specifically, the $n^-$-type semiconductor layer 103 is an island dielectrically isolated by the silicon dioxide films 102 and 105.

On the surface of the island $n^-$-type semiconductor layer 103, gate oxide films 107, gate electrodes 108, a p-type semiconductor layer 109, a source electrode 112, $n^+$-type semiconductor layers 110 and 111, and drain electrodes 113 are formed to form the n-type high voltage MOS transistor 100. The p-type semiconductor layer 109 is formed to form a channel region. The $n^+$-type semiconductor layers 110 are connected to the source electrode 112 and surrounded by the p-type semiconductor layer 109. The $n^+$-type semiconductor layers 111 are connected to the drain electrodes 113.

An n-type high voltage MOS transistors 150 in FIG. 2 has almost the same structure as the n-type high voltage MOS transistor 100 in FIG. 1. The n-type high voltage MOS transistor 150 is different from the n-type high voltage MOS transistor 100 in forming an $n^-$-type semiconductor layer 114 between the $n^-$-type semiconductor layer 103 and the silicon dioxide film 102 and forming an $n^+$-type semiconductor layer 115 between the $n^-$-type semiconductor layer 103 and the silicon dioxide film 105 so as to connect to the bottom of the $n^+$-type semiconductor layers 111. Here, the impurity concentration is set as relatively low in the $n^-$-type semiconductor layer 114 and the $n^+$-type semiconductor layer 115. By doing so, a depletion layer is also formed around the $n^-$-type semiconductor layer 114 and the $n^+$-type semiconductor layer 115 in the $n^-$-type semiconductor layer 103 so as to improve the operating.

Generally speaking, a voltage of 0V is applied to a semiconductor substrate 101 in the n-type high voltage MOS transistors 100 and 150 in FIGS. 1 and 2. When the potential of the p-type semiconductor layer 109 is almost the same as the potential of the semiconductor substrate 101, and a large and positive voltage is applied to the $n^+$-type semiconductor layers 111, a pn junction diode consisting of the p-type semiconductor layer 109 and the $n^-$-type semiconductor layer 103 is in a reverse bias state. In this case, a depletion layer extends from the interface between the p-type semiconductor layer 109 and the $n^-$-type semiconductor layer 103. Due to the large and positive voltage applied to the $n^+$-type semiconductor layers 111, the voltage of 0V applied to the semiconductor substrate 101, and the voltage applied to the p-type semiconductor layer 109, the depletion layer evenly extends in the $n^-$-type semiconductor layer 103 to reduce the internal electric field.

As a result, avalanche breakdown hardly occurs in the $n^-$-type semiconductor layer 103. The operating voltage of the n-type high voltage MOS transistor depends on the occurrence of the avalanche breakdown in the $n^-$-type semiconductor layer 103. Accordingly, avalanche breakdown prevention can improve the operating voltage in the reverse bias state.

In the conventional SOI semiconductor device, however, especially, when the potential of the $n^+$-type semiconductor layers 111 that are connected to the drain electrodes 113 is almost the same as the potential of the semiconductor substrate 101 as the supporting substrate of the SOI substrate, a depletion layer is not sufficiently formed in the $n^-$-type semiconductor layer 103. As a result, the operating voltage in the reverse bias state, which mainly depends on the avalanche breakdown, conspicuously deteriorates.

More specifically, in the reverse bias state, in which a large and negative voltage is applied to the p-type semiconductor layer 109, a general voltage of 0V is applied to the semiconductor substrate 101, and a voltage of 0V is applied to the $n^+$-type semiconductor layers 111, the semiconductor substrate 101 and the $n^+$-type semiconductor layers 111 are at the same potential. This adversely affects the extension of the depletion layer. As a result, the depletion layer extending from the pn junction interface of the between the p-type semiconductor layer 109 and the $n^-$-type semiconductor layer 103 does not sufficiently extend to reach regions of the $n^-$-type semiconductor layer 103 under the $n^+$-type semiconductor layers 111. Accordingly, the electric field strength arises in the $n^-$-type semiconductor layer 103 and the avalanche breakdown tends to occur to drastically deteriorate the reverse bias voltage of the n-type MOS transistor.

As has been described, the operating voltage cannot be kept relatively high in any reverse bias state according to the conventional SOI semiconductor device structure. The avalanche breakdown tends to easily occur to deteriorate the operating voltage in a specific condition.

SUMMARY OF THE INVENTION

It is accordingly the object of the present invention to provide an SOI semiconductor device with relatively high operating voltage in any reverse bias state.

The above-mentioned object may be achieved by an SOI semiconductor device including: a first semiconductor layer; a second semiconductor layer that is formed on a first part of a first main surface of the first semiconductor layer; a third semiconductor layer with a conductivity type different from a conductivity type of the second semiconductor layer, the third semiconductor layer being formed on a second part of the first main surface of the first semiconductor layer, the second part being separated from the first part; a fourth semiconductor layer with a conductivity type different from a conductivity type of the first semiconductor layer, he fourth semiconductor layer being formed on a second main surface of the first semiconductor layer; and a first insulating layer that is formed on a main surface of the fourth semiconductor layer opposite to the first semiconductor layer, wherein the fourth semiconductor layer includes an impurity of an amount that is large enough so as not to be completely depleted even when a reverse bias voltage is applied between the second and third semiconductor layers.

In the SOI semiconductor device, the fourth semiconductor layer is not completely depleted when a reverse bias voltage is applied between the second and third semiconductor layers. As a result, the fourth semiconductor layer, which is not completely depleted, keeps the potential almost constant at the bottom of the first semiconductor layer and the depletion layer is easy to extend in the first semiconductor layer. Also, by applying a reverse bias voltage to the pn junction comprising the fourth and first semiconductor layers, a depletion layer extends from the pn junction to the first semiconductor layer. Accordingly, when any reverse bias voltage is applied between the second and third semiconductor layers, the depletion layer can be evenly extend in the first semiconductor layer and the internal electric field is reduced, so that an SOI semiconductor device with a favorable operating voltage at the reverse bias state is realized.

Here, it is preferable to set the impurity amount per unit area in the fourth semiconductor layer as larger than $3\times10^{12}/cm^2$ or larger than 1.5 times the impurity amount per unit area in the first semiconductor layer. By doing so, the fourth semiconductor layer can be prevented from being completely depleted. Also, the depletion layer formed at the pn junction comprising of the first and fourth semiconductor layers by a reverse bias extends more widely on the side of the first semiconductor layer to help the depletion layer in the first semiconductor layer evenly extend.

The above-mentioned object may also be achieved by the SOI semiconductor device, wherein an isolation trench is formed in an outer region of the first semiconductor layer so as to surround the second and third semiconductor layers and be deep enough to reach the first insulating layer, and a second insulating layer is formed on an side wall of the isolation trench. As a result, even if other semiconductor elements are formed adjacent to the SOI semiconductor device on the same semiconductor substrate, the SOI semiconductor device is not affected by the potential of the other semiconductor elements and operates with stability. Further, the above-mentioned object may also be achieved by the SOI semiconductor device, wherein a fifth semiconductor layer with the same conductivity type as the conductivity type of the fourth semiconductor layer is formed at an interface between the first semiconductor layer and the second insulating layer. As a result, pn junction separation is realized by the first and fifth semiconductor layers, and the effects of the potential of the adjacent semiconductor elements are further reduced.

In addition, when the isolation trench is filled with an electrically conductive material, the electrically conductive material is provided with an electrode. When an voltage of the same potential as the voltage applied to the insulating layer is applied to the electrode, the SOI semiconductor device is electrically shielded. As a result, the effects of the potential of the adjacent semiconductor elements are further reduced.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings.

DESCRIPTION OF THE PREFERRED EMBODIMENTS

An explanation of preferred embodiments of the SOI semiconductor device according to the present invention will be given below with reference to figures.

The First Embodiment

In the first embodiment, an n-type high voltage MOS transistor will be described as an example of the SOI semiconductor device according to the present invention.

(Structure of N-type High Voltage MOS Transistor)

Figure 3:
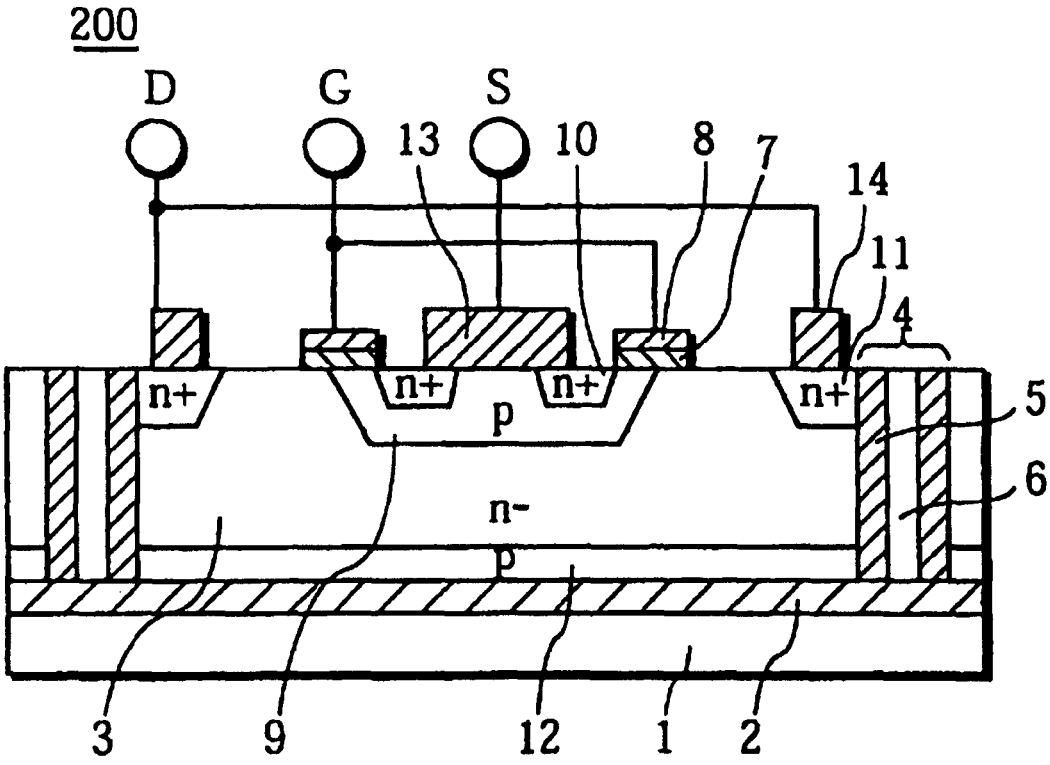
FIG. 3 is a sectional view of the main structure of an n-type high voltage MOS transistor according to the first embodiment the present invention.

FIG. 3 is a sectional view of the main structure of an n-type high voltage MOS transistor 200 according to the first embodiment of the present invention. As shown in FIG. 3, an $n^-$-type semiconductor layer 3 overlies a semiconductor substrate 1 via a silicon dioxide film 2 to form the n-type high voltage MOS transistor 200. The $n^-$-type semiconductor layer 3 is the first semiconductor layer and the active layer of the SOI substrate. The semiconductor substrate 1 is the supporting substrate of the SOI substrate. The silicon dioxide film 2 is the first insulator film. While only one MOS transistor is shown in FIG. 3, a plurality of MOS transistor elements are actually formed so as to be adjacent to each other on the same semiconductor substrate. In order to electrically insulate adjacent elements, an isolation trench 4 is formed in the outer region of the $n^-$-type semiconductor layer 3.

The isolation trench 4 is formed by etching so as to reach the silicon dioxide film 2. On the side walls of the isolation trench 4, silicon dioxide films 5 are formed as the second insulator film. The silicon dioxide films 5 and the silicon dioxide film 2 isolate the $n^-$-type semiconductor layer 3 as an island dielectrically isolated from other elements.

In the space between the silicon dioxide films 5, a polysilicon film 6 is filled as a conductive material with a high resistance. Even if the silicon dioxide films on the opposite side walls are at different potentials, the potential gradient is solved by a small current through the polysilicon film 6 so that no unnecessary electric field arises in the isolation trench 4.

On the island $n^-$-type semiconductor layer 3, gate oxide films 7, gate electrodes 8, a p-type semiconductor layer 9, a source electrode 13, $n^+$-type semiconductor layers 10, drain electrodes 14, and $n^+$-type semiconductor layers 11 are formed in the manner well known in the art. The p-type semiconductor layer 9 is the second semiconductor layer for forming a channel region. The $n^+$-type semiconductor layers 10 are formed so as to be connected to the source electrode 13 and surrounded by the p-type semiconductor layer 9. The $n^-$-type semiconductor layers 11 are connected to the drain electrodes 14 and is the third semiconductor layer.

On the other hand, at the interface between the island $n^-$-type semiconductor layer 3 and the embedded silicon dioxide film 2, a p-type semiconductor layer 12 is formed as the fourth semiconductor layer. The p-type semiconductor layer 12 is set to include impurity of more than $3\times10^{12}/cm^2$ so as not to be completely depleted in the reverse bias state. On this matter, a more detailed explanation will be given later.

(Manufacturing Method)

An overall explanation of the manufacturing method of the n-type high voltage MOS transistor 200 will be given below.

The p-type semiconductor layer 12 is formed by injecting an amount of impurity that is no smaller than a predetermined amount into the surface of the $n^-$-type semiconductor layer 3 that has been formed on at least one of the main surfaces of a semiconductor substrate (referred to the "active layer substrate" in this specification) by the ion implantation or the thermal diffusion. Meanwhile, the silicon dioxide film 2 is formed on the surface of the semiconductor substrate 1, which is the supporting substrate of the SOI substrate, according to the CVD (Chemical Vapor Deposition) method and the like. The semiconductor substrate 1 and the active layer substrate are bonded together with heat treatment so that the silicon dioxide film 2 overlies the p-type semiconductor layer 12. In this manner, the SOI substrate is manufactured.

Note that the silicon dioxide film 2 can be formed on the surface of the p-type semiconductor layer 12 on the $n^-$-type semiconductor layer 3 instead of being formed on the surface of the semiconductor substrate 1. Also, the silicon dioxide film 2 can be formed on both of the surfaces of the semiconductor substrate 1 and the p-type semiconductor layer 12.

The surface of the $n^-$-type semiconductor layer 3 is polished so as to have the desired thickness. The isolation trench 4 is, then, formed so as to reach the silicon dioxide film 2 by etching the SOI substrate from the side of the $n^-$-type semiconductor layer 3. In etching process, a photo resist mask is used or a patterned silicon dioxide film or silicon nitride film is used as a mask. After the etching process, the silicon dioxide films 5 are formed on the side walls of the isolation trench 4 and space between the silicon dioxide films 5 is filled with the polysilicon film 6 so as to dielectrically isolate the $n^-$-type semiconductor layer 3 as an island.

On the dielectrically isolated island $n^-$-type semiconductor layer 3, then, the gate oxide films 7 and the gate electrodes 8 are formed, and the p-type semiconductor layer 9 for a channel region is formed by ion implantation and heat treatment. Also in the $n^-$-type semiconductor layer 3, the $n^+$-type semiconductor layers 10, which are to be the source, are formed so as to be surrounded by the p-type semiconductor layer 9 and the $n^+$-type semiconductor layers 11, which are to be the drain, are formed so as not to come in contact with the p-type semiconductor layer 9. Finally, the source electrode 13 and the drain electrodes 14 are connected to the $n^+$-type semiconductor layers 10 and the $n^+$-type semiconductor layers 11, respectively to manufacture the n-type high voltage MOS transistor 200.

Here, the p-type semiconductor layer 12 is formed on the surface of the $n^-$-type semiconductor layer 3 on at least one of the main surfaces before the $n^-$-type semiconductor layer 3 and the semiconductor substrate 1 are bonded together. Instead, the p-type semiconductor layer 12 can be formed in this way. An active layer substrate with the $n^-$-type semiconductor layer 3 and the semiconductor substrate 1 are bonded together so as to sandwich the silicon dioxide film 2. Then, the surface of the $n^-$-type semiconductor layer 3 is polished so as to have the desired thickness. After that, the p-type semiconductor layer 12 is formed at the bottom of the $n^-$-type semiconductor layer 3 by implanting ion from the surface of the $n^-$-type semiconductor layer 3 according to the high energy ion implantation.

Also, while the semiconductor substrate 1 and the active layer substrate are bonded together so as to sandwich the silicon dioxide film 2 in this manufacturing method, the silicon dioxide film 2 can be formed at the bottom of the $n^-$-type semiconductor layer 3 by implanting oxygen ion into the active layer substrate.

Moreover, while the surface of the $n^-$-type semiconductor layer 3 is polished so as to have the desired thickness in this manufacturing method, the thickness can be adjusted in other ways. For instance, hydrogen and the like is implanted into the $n^-$-type semiconductor layer 3 in advance and the surface of the $n^-$-type semiconductor layer 3 is polished after appropriate degree of heat treatment or pressure.

Here, an explanation of the operating voltage of the n-type high voltage MOS transistor 200 according to the present embodiment will be given.

Generally speaking, a voltage of 0V is applied to the semiconductor substrate 1, which is the supporting substrate of the SOI substrate, in the n-type high voltage MOS transistor 200. Via the gate electrodes 8 and the source electrode 13, almost the same degree of voltage, i.e., a voltage "A", is applied to the p-type semiconductor layer 9 and the $n^+$-type semiconductor layers 10 so as to set the n-type high voltage MOS transistor 200 at the OFF state. In this condition, a voltage "B", which has a positive potential larger than the voltage "A", is applied to the $n^+$-type semiconductor layers 11 via the drain electrodes 14. As a result, the pn junction diode consisting of the p-type semiconductor layer 9 and the $n^-$-type semiconductor layer 3 is set at the reverse bias state, and a depletion layer extends from the pn junction interface between the p-type semiconductor layer 9 and the $n^-$-type semiconductor layer 3 into the $n^-$-type semiconductor layer 3. Explained later, the degree of the extension of the depletion layer significantly affects the operating voltage of the n-type high voltage MOS transistor 200.

While a variety of combination of the voltages "A" and "B" sets the n-type high voltage MOS transistor 200 at the reverse bias, the present embodiment will focus on the operating voltage in the following two conditions. (1) A voltage of 0V is applied to the semiconductor substrate 1, a voltage of 0V is also applied to the source electrode 13 as the voltage "A", and a voltage of 400V is applied to the drain electrodes 14 as a positive and large voltage, i.e., the voltage "B" (referred to the "first reverse bias state" in this specification). (2) A voltage of −0V is applied to the semiconductor substrate 1, a voltage of [400V] *−400V* is applied to the source electrode 3 as the voltage "A", and a voltage of 0V is applied to the drain electrodes 14 as the voltage "B" (referred to the "second reverse bias state" in this specification).

Figure 4A:
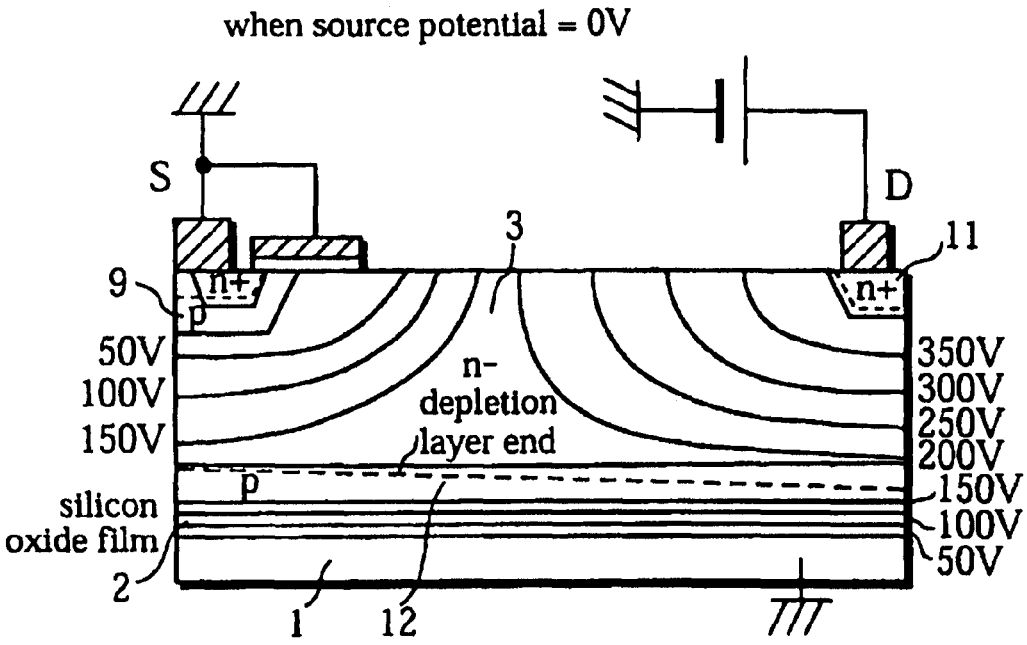
FIG. 4A shows the simulation result of the internal potential distribution and depletion layer extension when the n-type high voltage MOS transistor according to the first embodiment is set at a reverse bias state by applying a voltage of 0V to a source electrode.
Figure 4B:
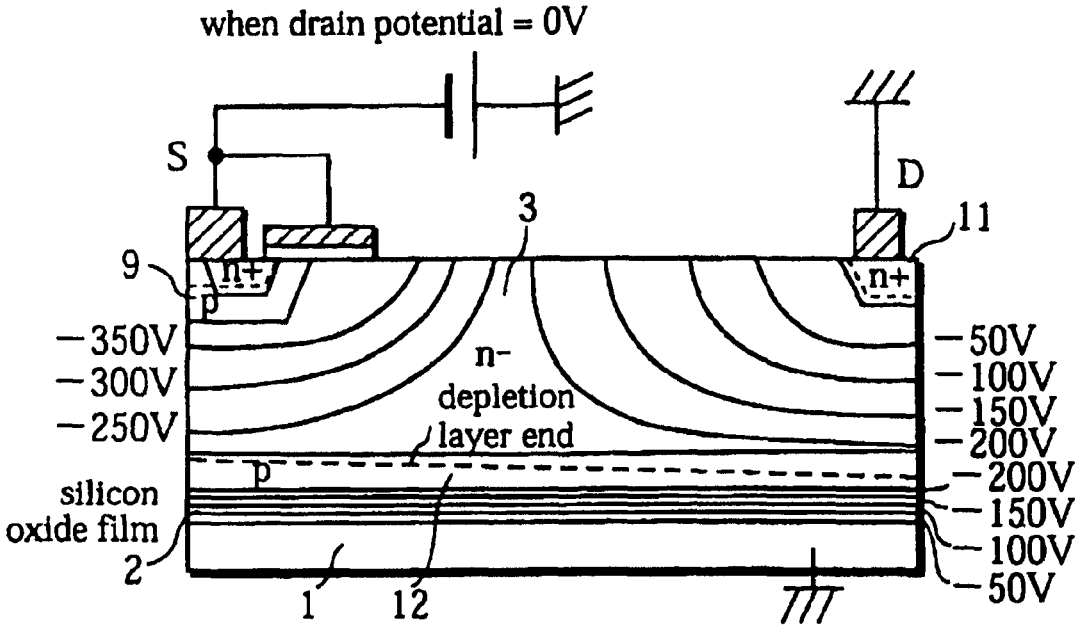
FIG. 4B shows the simulation result of the internal potential distribution and depletion layer extension when the n-type high voltage MOS transistor according to the first embodiment is set at a reverse bias state by applying a voltage of 0V to a drain electrode.

FIG. 4A is a diagram showing the simulation result of the internal potential distribution and the depletion layer extension when the n-type high voltage MOS transistor 200 is set at the first reverse bias state. FIG. 4B is a diagram showing the simulation result of the internal potential distribution and the depletion layer extension when the n-type high voltage MOS transistor 200 is set at the second reverse bias state. Each of FIGS. 4A and 4B shows a perspective cross section of the right-half of the n-type high voltage MOS transistor 200.

In each of FIGS. 4A and 4B, the depletion layer extends from the pn junction interface between the p-type semiconductor layer 9 and the $n^-$-type semiconductor layer 3 to the depletion layer end that is indicated by the dashed line, i.e., the inside of the $n^-$-type semiconductor layer 3 is completely depleted. As a result, the potential distribution inside of the $n^-$-type semiconductor layer 3 is so uniform that the internal electric field is reduced to hardly cause avalanche breakdown. Generally speaking, the operating voltage of the n-type high voltage MOS transistor depends on the avalanche breakdown in the $n^-$-type semiconductor layer 3. Accordingly, in the n-type high voltage MOS transistor 200, a favorable operating voltage at the reverse bias state can be obtained.

On the other hand, in the conventional n-type high voltage MOS transistor 100, a favorable operating voltage at the reverse bias state can not be always obtained.

Figure 1:
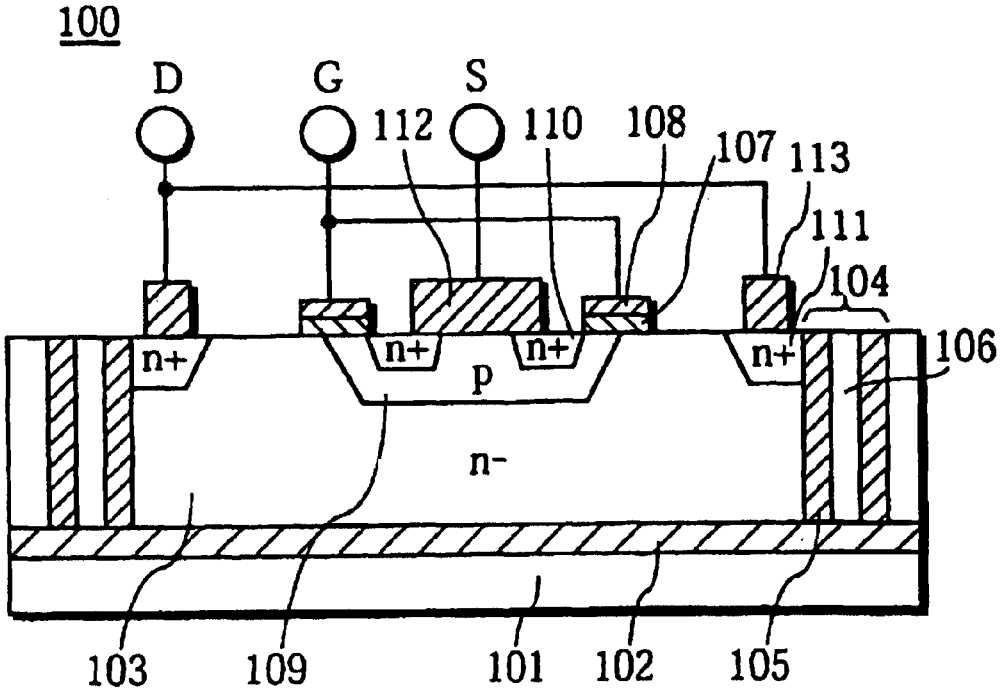
FIG. 1 shows the structure of the n-type high voltage MOS transistor of a conventional SOI semiconductor device with a dielectric isolation structure.
Figure 2:
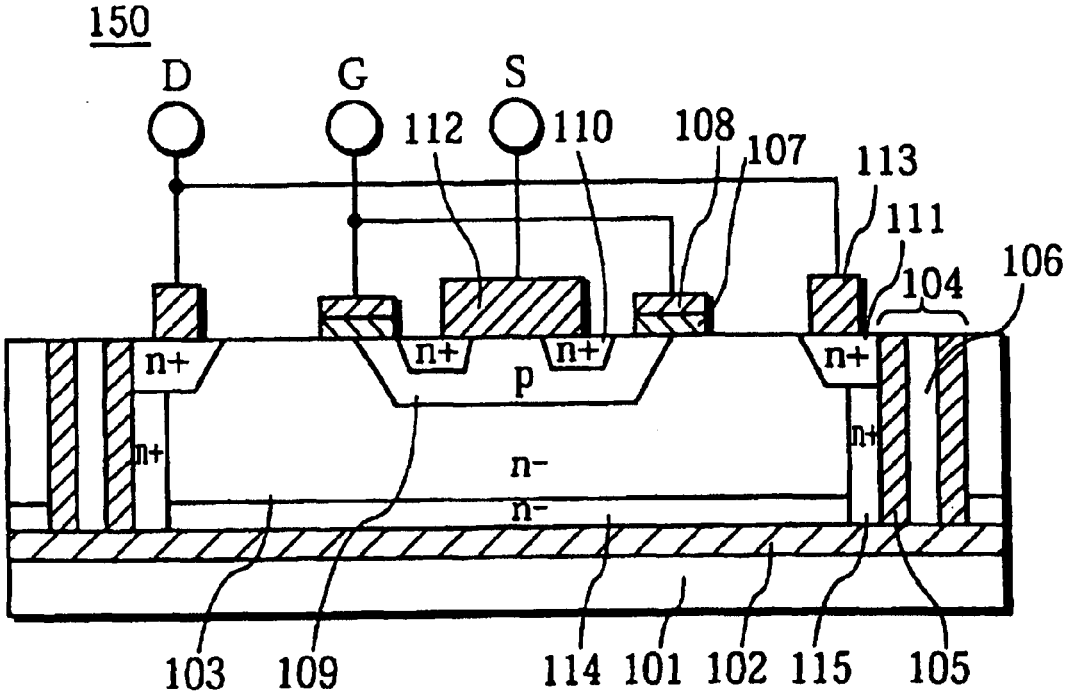
FIG. 2 shows the structure of the n-type high voltage MOS transistor of another conventional SOI semiconductor device with a dielectric isolation structure.
Figure 5A:
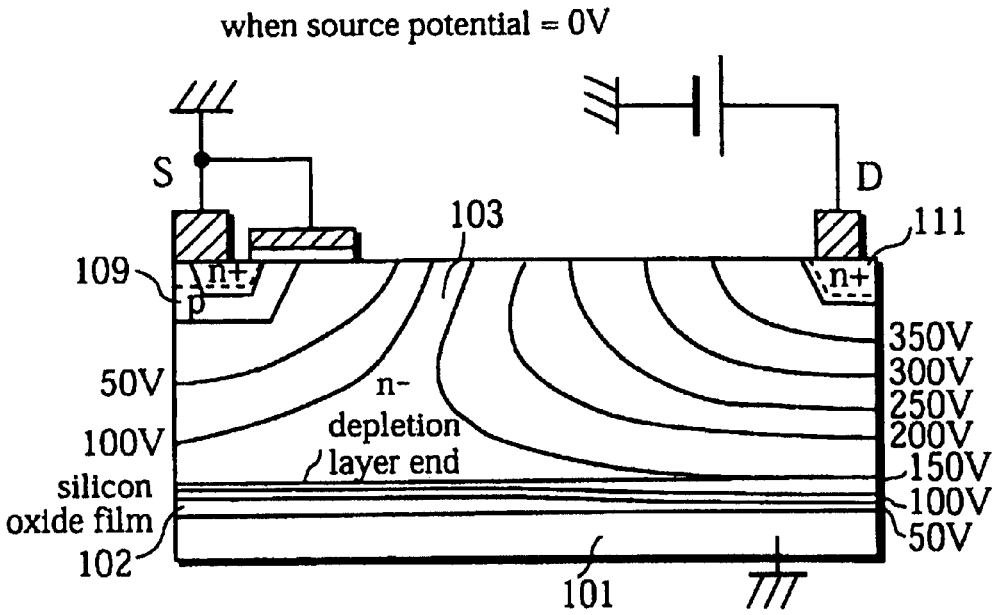
FIG. 5A shows the simulation result of the internal potential distribution and depletion layer extension when the conventional n-type high voltage MOS transistor shown in FIG. 1 is set at a reverse bias state by applying a voltage of 0V to a source electrode.
Figure 5B:
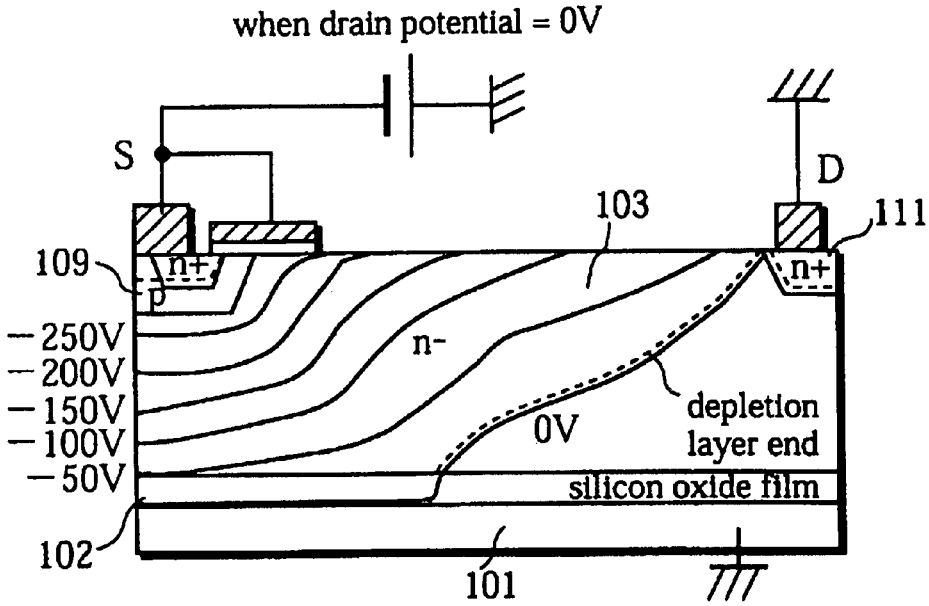
FIG. 5B shows the simulation result of the internal potential distribution and depletion layer extension when the conventional n-type high voltage MOS transistor shown in FIG. 1 is set at a reverse bias state by applying a voltage of 0V to a drain electrode.

FIG. 5A is a diagram showing the simulation result of the internal potential distribution and the depletion layer extension when the n-type high voltage MOS transistor 100 is set at the first reverse bias state. FIG. 5B is a diagram showing the simulation result of the internal potential distribution and the depletion layer extension when the n-type high voltage MOS transistor 100 is set at the second reverse bias state. Each of FIGS. 5A and 5B shows a perspective cross section of the right half, i.e., the substantial part of the n-type high voltage MOS transistor 100 shown in FIG. 1.

As shown in FIG. 5A, even in the conventional n-type high voltage MOS transistor 100, the inside of the $n^-$-type semiconductor layer 3 is completely depleted, the potential distribution in the $n^-$-type semiconductor layer 3 is significantly sparse, and the internal electric field is reduced in the first reverse bias state, in which the source potential is 0V, as in the case of the present embodiment. As a result, the avalanche breakdown hardly occurs in the $n^-$-type semiconductor layer 3 and a favorable operating voltage at the reverse bias state can be obtained.

On the other hand, in the second reverse bias state, in which the drain potential is 0V, a voltage of 0V is applied to both of the $n^+$-type semiconductor layers 11 and the semiconductor substrate 1. As a result, as shown in FIG. 5B, the depletion layer extending from the pn junction interface between the p-type semiconductor layer 9 and the $n^-$-type semiconductor layer 3 does not extend enough to reach a region of the $n^-$-type semiconductor layer 3 under the $n^+$-type semiconductor layers 11, i.e., the depletion layer is prevented from extending. As a result, the internal electric field is not reduced, so that the operating voltage at the reverse bias state of the n-type high voltage MOS transistor drastically deteriorates. Accordingly, a voltage of −400V can not be applied as the voltage "A".

As has been described, in the second reverse bias state, a voltage of 0V is applied to both the $n^+$-type semiconductor layers 11 and the semiconductor substrate 1, i.e., the $n^+$-type semiconductor layers 11 and the semiconductor substrate 1 are at the same potential. As a result, it is inevitable in the reverse bias state in the conventional n-type high voltage MOS transistor 100 that the depletion layer area is decreased and the operating voltage deteriorates.

On the other hand, according to the n-type high voltage MOS transistor 200, the depletion layer extends throughout the inside of the $n^-$-type semiconductor layer 3 as shown in FIG. 4B, so that the same level of reverse bias operating voltage as the case in FIG. 4A is obtained.

More specifically, in addition to having the p-type semiconductor layer 12 between the silicon dioxide film 2 and the n-type semiconductor layer 3, the impurity concentration in the p-type semiconductor layer 12 is set so as to prevent the p-type semiconductor layer 12 from being completely depleted (higher than $3\times10^{12}/cm^2$) according to the present embodiment. As a result, the p-type semiconductor layer 12 that is not completely depleted keeps the potential at the bottom of the $n^-$-type semiconductor layer 3 approximately constant. Also, as a result of the reverse bias applied to the pn junction consisting of the p-type semiconductor layer 12 and the $n^-$-type semiconductor layer 3, the depletion layer extends from the pn junction to the inside of the $n^-$-type semiconductor layer 3.

As mentioned above, the operating voltage of the n-type high voltage MOS transistor significantly depends on the avalanche breakdown in the $n^-$-type semiconductor layer 3. According to the present embodiment, however, the impurity concentration of the p-type semiconductor layer 12 is set so as not to completely deplete the p-type semiconductor layer 12 even in the second reverse bias state, so that the depletion layer extends throughout the inside of the $n^-$-type semiconductor layer 3. As a result, the potential distribution is uniform and the avalanche breakdown hardly occurs. Accordingly, a favorable operating voltage at the reverse bias state can be obtained for the n-type high voltage MOS transistor.

(Relationship Between Impurity Amount in Each Semiconductor Layer and Maximum Operating Voltage)

Figure 6A:
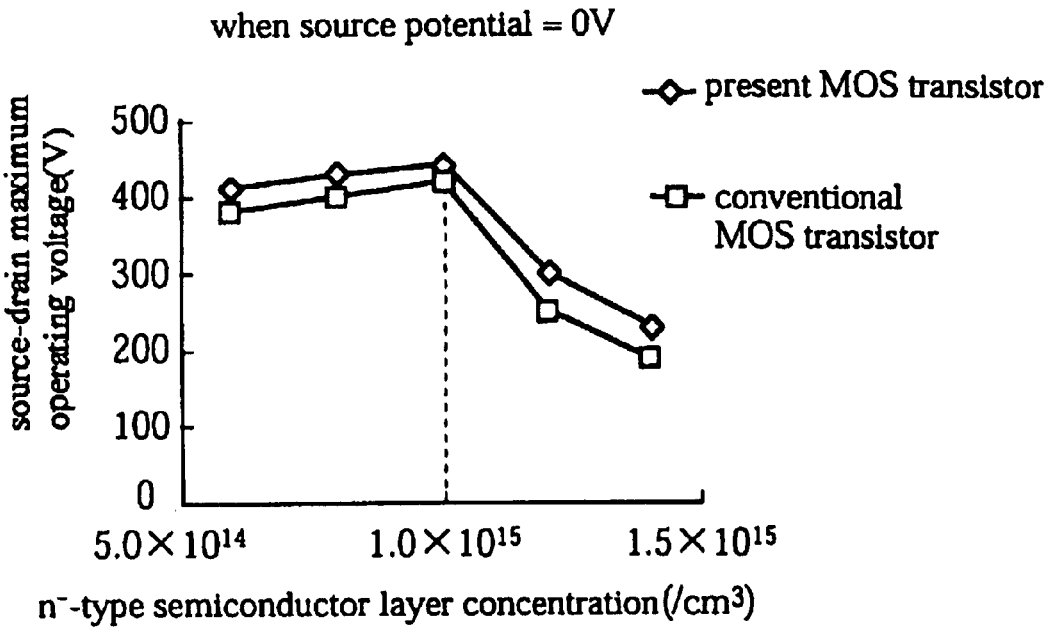
FIG. 6A shows relationship between the impurity concentration in an $n^-$-type semiconductor layer and the source-drain maximum operating voltage when the conventional n-type high voltage MOS transistor and the n-type high voltage MOS transistor according to the first embodiment are set at a reverse bias state by applying a voltage of 0V to the source electrode.
Figure 6B:
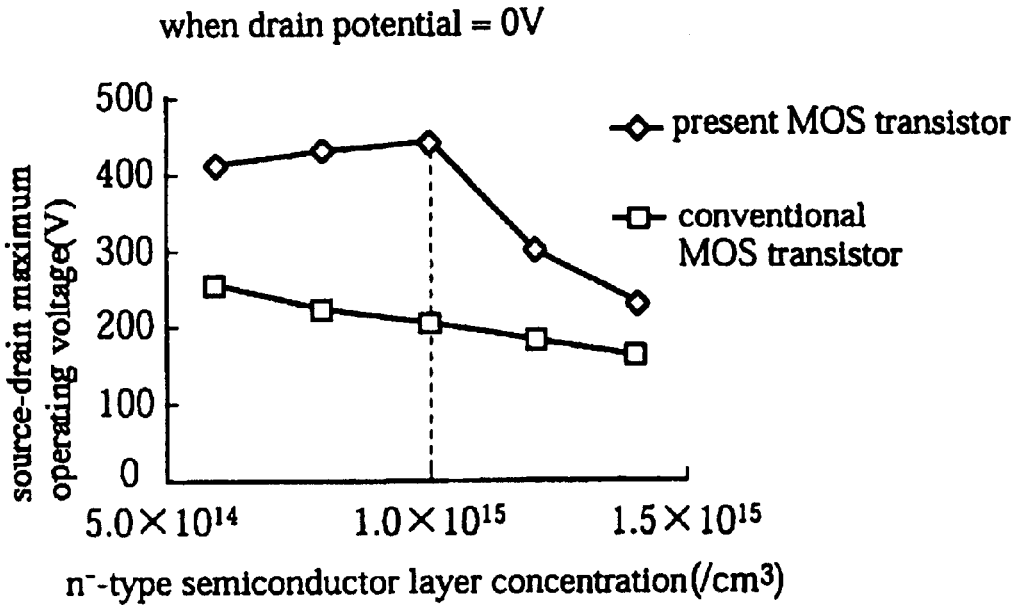
FIG. 6B shows relationship between the impurity concentration in an $n^-$-type semiconductor layer and the source-drain maximum operating voltage when the conventional n-type high voltage MOS transistor and the n-type high voltage MOS transistor according to the first embodiment are set at a reverse bias state by applying a voltage of 0V to the drain electrode.

FIGS. 6A and 6B show relationship between the source-drain maximum operating voltage and the impurity amount (impurity concentration) in the $n^-$-type semiconductor layer that is to be the active layer of the transistor in the n-type high voltage MOS transistor 200 (the present MOS transistor) and the conventional n-type high voltage MOS transistor 100 (the conventional MOS transistor). While FIG. 6A shows the relationship between the source-drain maximum operating voltage and the impurity concentration in the first reverse bias state (the source potential=0V), FIG. 6B shows the relationship in the second reverse bias state (the drain potential=0V).

In the first reverse bias state, the present MOS transistor and the conventional MOS transistor have almost the same properties as shown in FIG. 6A. Both of the MOS transistors show higher maximum operating voltages when the impurity amount in the $n^-$-type semiconductor layer 3 is $5.0\times10^{14}$ to $1.0\times10^{15}/cm^3$.

On the other hand, in the second reverse bias state, while a favorable operating voltage at the reverse bias state is obtained for the present MOS transistor similarly to the case in FIG. 6A, the source-drain maximum operating voltage drastically deteriorates for the conventional transistor as shown in FIG. 6B. Especially, when the impurity concentration is no higher than $1.0\times10^{15}/cm^3$, the source-drain maximum operating voltage of the conventional MOS transistor deteriorates to the extent of approximately half of that of the present MOS transistor.

Accordingly, a favorable source-drain maximum operating voltage can be obtained in both of the first and second reverse bias states for the n-type high voltage MOS transistor 200. Especially, when the impurity concentration in the $n^-$-type semiconductor layer 3 is $5.0\times10^{14}$ to $1.0\times10^{15}/cm^3$, profound effects can be obtained.

In the present embodiment, as has been described, the operating voltage is improved since the p-type semiconductor layer 12 is not completely depleted. Note that the size of the depletion layer depends on the impurity amount in the p-type semiconductor layer 12. Accordingly, it is necessary not only to interpose the p-type semiconductor layer 12 between the $n^-$-type semiconductor layer 3 and the silicon dioxide film 2 but also to set the impurity amount in the p-type semiconductor layer 12 at an appropriate value so as not to completely deplete the p-type semiconductor layer 12 even if a predetermined reverse bias voltage is applied.

Figure 7:
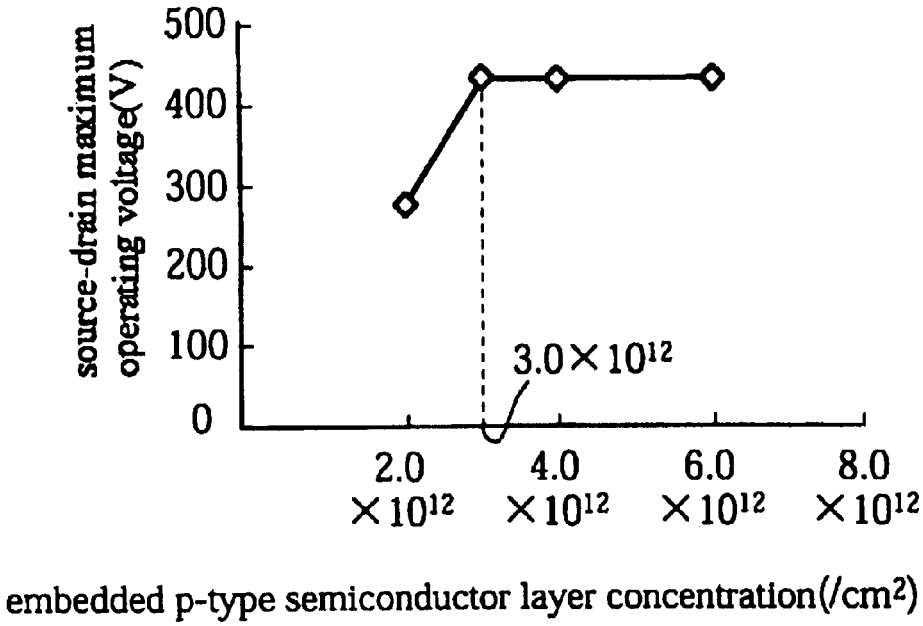
FIG. 7 shows relationship between the impurity concentration in a p-type semiconductor layer, which has been formed so as to be adjacent to an insulator film, and the source-drain maximum operating voltage in the n-type high voltage MOS transistor according to the first embodiment.

FIG. 7 is a plot showing the result of an experiment on the dependence of the source-drain maximum operating voltage on the impurity concentration in the p-type semiconductor layer 12 in the n-type high voltage MOS transistor according to the present embodiment. Note that the impurity concentration in the $n^-$-type semiconductor layer 3 is set at $1.0\times10^{15}/cm^3$ and the $n^-$-type semiconductor layer 3 thickness is set at 20 μm in this experiment.

As shown in FIG. 7, when the impurity concentration in the p-type semiconductor layer 12 is lower than $3.0\times10^{12}/cm^2$, the source-drain maximum operating voltage drastically deteriorates. This can be explained as follows. When the impurity concentration in the p-type semiconductor layer 12 becomes lower than $3.0\times10^{12}/cm^2$, the p-type semiconductor layer 12 begins to be completely depleted especially in the second reverse bias state. As a result, the p-type semiconductor layer 12 stops keeping the potential at the bottom of the $n^-$-type semiconductor layer 3 approximately constant, so that the depletion layer does not extend evenly. Accordingly, the internal electric field locally concentrates to drastically deteriorate the reverse vias operating voltage of the n-type high voltage MOS transistor.

On the other hand, when the impurity concentration is no lower than $3.0\times10^{12}/cm^2$, an excellently high operating voltage is obtained. Here, while the maximum operating voltage reaches the critical point when the impurity concentration becomes $3.0\times10^{12}/cm^2$, it is favorable to set the impurity concentration at a value higher than $3.0\times10^{12}/cm^2$ so as to obtain a stable high operating voltage since the critical point can sensitively change according to environmental temperature.

Meanwhile, when a reverse bias voltage is applied to a pn junction semiconductor, a depletion layer is formed so as to sandwich the pn junction interface. Suppose that the thickness of the entire depletion layer is "W", the depletion layer thickness for the p-type semiconductor layer is "Wp", and the depletion layer thickness for n-type semiconductor layer is "Wn", W=Wp+Wn. It is well known that, suppose that the amounts of impurity per unit area in the p-type semiconductor layer and the n-type semiconductor layer are "dp" and "dn", respectively, the thickness "WP" and "Wn" are inversely proportional to the impurity amount "dp" and "dn" approximately.

Accordingly, as the impurity concentration of the p-type semiconductor layer 12 increases, the depletion layer is formed more narrowly in the p-type semiconductor layer 12. In the present invention, the maximum impurity concentration of the p-type semiconductor layer 12 is the upper limit of the solution of the impurity in the silicon.

More specifically, the upper limit of the solution of boron (B), which is generally used as the impurity of the P-type semiconductor, is $5.0\times10^{20}/cm^3$, which is approximately $1.0\times10^{17}/cm^2$ on a per unit area basis for a device in practical use. Note that FIG. 7 shows experimental data when the impurity concentration of the $n^-$-type semiconductor layer 3 is $1.0\times10^{15}/cm^3$ as mentioned earlier. As shown in FIGS. 6A and 6B, it is preferable to set the impurity concentration of the $n^-$-type semiconductor layer 3 as no higher than 1.0×

$10^{15}/cm^3$ to obtain a favorable operating voltage. In addition, consider the fact that the depletion layer is more narrowly formed in the p-type semiconductor layer 12 as the impurity concentration of the p-type semiconductor layer 12 increases. Under the circumstances, a favorable operating voltage can be obtained for all the n-type high voltage MOS transistor when the following condition is satisfied. The impurity concentration of the p-type semiconductor layer 12 needs to be higher than the lower limit of the impurity concentration of the p-type semiconductor layer 12 ($3.0\times10^{12}/cm^2$) that is required to obtain a favorable operating voltage when the impurity concentration of the $n^-$-type semiconductor layer 3 is set at the upper limit ($1.0\times10^{15}/cm^3$).

Generally, the impurity amount in the $n^-$-type semiconductor layer 3 is set no larger than $1.0\times10^{15}/cm^3$ for the semiconductor element. Accordingly, when the impurity concentration of the p-type semiconductor layer 12 is higher than $3.0\times10^{12}/cm^2$, a favorable operating voltage can be obtained for all the n-type high voltage MOS transistor.

On the other hand, the impurity concentration of the $n^-$-type semiconductor layer 3, i.e., $1.0\times10^{15}/cm^3$ is $(1.0\times10^{15})\times(2.0\times10^{-3})=2.0\times10^{12}(/cm^2)$ on a per unit area basis since the thickness of the $n^-$-type semiconductor layer 3 is set at 20 μm ($2.0\times10^{-3}$cm) in this example.

Here, only the condition that the impurity concentration of the p-type semiconductor layer 12 is higher than the lower limit, i.e., ($3.0\times10^{12}/cm^2$), needs to be satisfied. As a result, when the impurity concentration per unit area of the p-type semiconductor layer 12 is set as higher than $(3.0\times10^{12}/(2.0\times10^{12})=1.5$ times the impurity concentration per unit area of the $n^-$-type semiconductor layer 3, a favorable operating voltage can be obtained for all the n-type high voltage MOS transistor.

As has been described, the ratio between the thicknesses of the depletion layer in the p-type and n-type semiconductors is inversely proportional to the impurity amounts per unit area of the p-type and n-type semiconductor when a reverse bias voltage is applied to the pn junction semiconductor. Meanwhile, the impurity concentration per unit area can be set irrelevant to the thickness of the semiconductor layer. As a result, even if the thickness of the $n^-$-type semiconductor layer 3 is not 20 μm as in the case of this example, when the impurity amount per unit area in the p-type semiconductor layer 12 is larger than 1.5 times the impurity concentration per unit area of the $n^-$-type semiconductor layer 3, a favorable operating voltage can be obtained.

As has been described, in the n-type high voltage MOS transistor 200 according to the present embodiment, the p-type semiconductor layer 12, which has a different conductivity type from the $n^-$-type semiconductor layer 3 and the impurity concentration is set to satisfy the condition that has been described, is sandwiched between the $n^-$-type semiconductor layer 3 and the silicon dioxide film 2. As a result, the depletion layer in the $n^-$-type semiconductor layer 3 is encouraged to evenly extend, so that the internal electric field is reduced and a favorable reverse bias operating voltage can be obtained.

While explanations of the structure of the n-type high voltage MOS transistor 200 according to the present embodiment and the impurity amount have been given taking specific examples that is in the first and second reverse bias states, the theory that the p-type semiconductor layer 12 encourage the depletion layer to extend can be similarly applied to other reverse bias states. Also, the depletion layer tends to be prevented from extending most in the second reverse bias state, i.e., in the condition in which a voltage of 0V is applied to the semiconductor substrate 1 and the drain electrodes 14 and a negative high voltage is applied to the source electrode 13. As a result, when the structure and the conditions of the p-type semiconductor layer 12 that have been described are realized in all the other reverse bias states, a favorable operating voltage can be obtained.

The Second Embodiment

Figure 8:
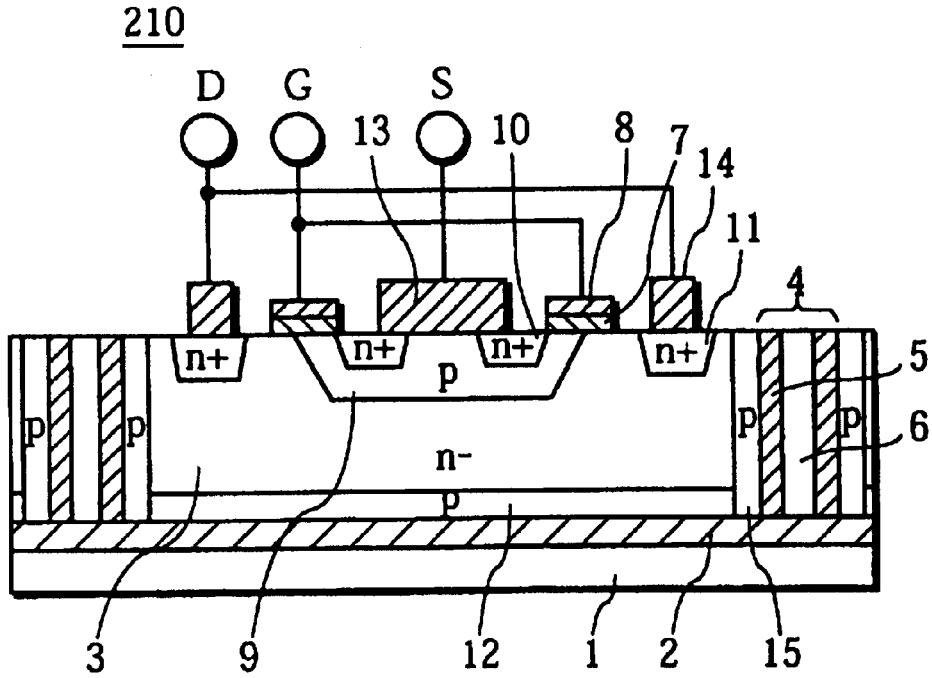
FIG. 8 is a sectional view of the main structure of an n-type high voltage MOS transistor according to the second embodiment of the present invention.

FIG. 8 is a sectional view of the main structure of an n-type high voltage MOS transistor 210 according to the second embodiment of the present invention.

The n-type high voltage MOS transistor 210 is different from the n-type high voltage MOS transistor 200 in FIG. 3 in forming a p-type semiconductor layer 15, which has the same conductivity type as the p-type semiconductor layer 12, as the fifth semiconductor layer along the interface between the $n^-$-type semiconductor layer 3 and the silicon dioxide film 5 that has been formed on the side wall of the isolation trench 4.

In order to encourage to extend the depletion layer throughout the inside of the $n^-$-type semiconductor layer 3 even in the reverse bias state, it is preferable to set the impurity amount per unit area in the p-type semiconductor layer 15 as larger than $3.0\times10/cm^2$ as in the case of the p-type semiconductor layer 12.

The p-type semiconductor layer 15 is formed as follows, for instance. Before the forming of the isolation trench 4 in the $n^-$-type semiconductor layer 3, a p-type semiconductor layer in an area be slightly wider than the isolation trench 4 is formed according to the ion implantation so as to reach the silicon dioxide film 2. Then, the isolation trench 4 is formed inside of the p-type semiconductor layer by etching.

With this structure, the n-type high voltage MOS transistor 210 has a relatively improved operating voltage as in the case of the n-type high voltage MOS transistor 200 in the first embodiment. Also, due to the pn junction isolation by the p-type semiconductor layer 15 and the $n^-$-type semiconductor layer 3, the effects of the potentials of the adjacent semiconductor elements can be further prevented.

The Third Embodiment

Figure 9:
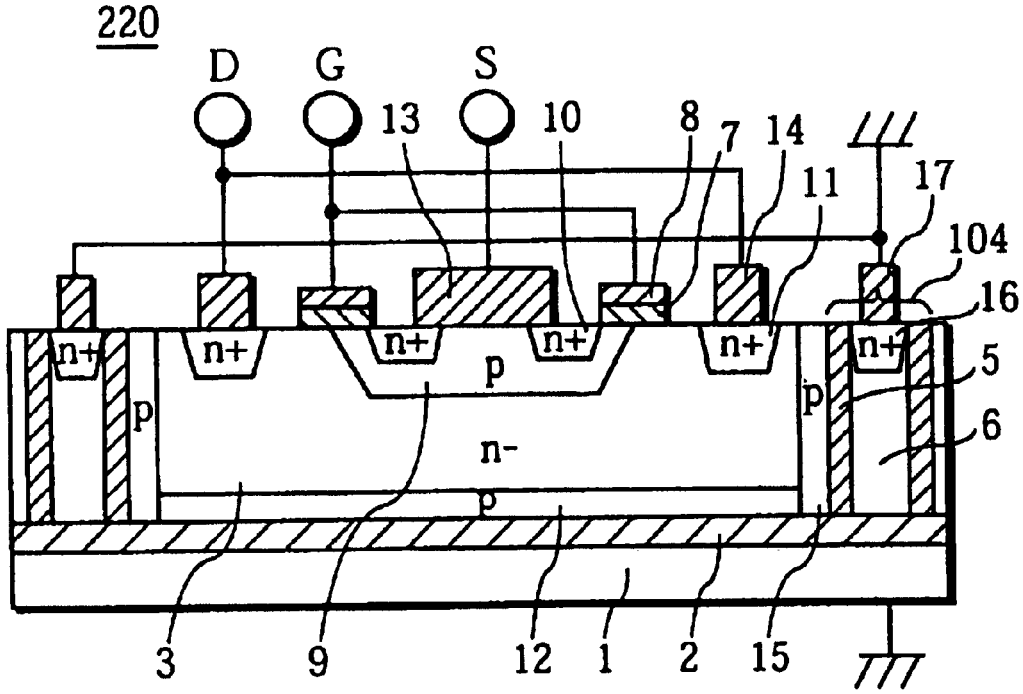
FIG. 9 is a sectional view of the main structure of an n-type high voltage MOS transistor according to the third embodiment of the present invention.

FIG. 9 is a sectional view of the main structure of an n-type high voltage MOS transistor 220 according to the third embodiment of the present invention. The n-type high voltage MOS transistor 220 is different from the n-type high voltage MOS transistor 210 in being provided with $n^+$-type semiconductor layers 16 and electrodes 17. The $n^+$-type semiconductor layers 16 are formed by implanting impurity into the surface of the polysilicon film 6 that has been filled in the isolation trench 4. On the $n^+$-type semiconductor layers 16, the electrodes 17 are formed.

With this structure, the n-type high voltage MOS transistor 220 has almost the same operating voltage as the n-type high voltage MOS transistors 200 and 210. Also, for instance, when a voltage at the same potential as the voltage that has been applied to the semiconductor substrate 1, i.e., a voltage of a ground potential is applied to the $n^+$-type semiconductor layers 16 via the electrodes 17, the n-type high voltage MOS transistor 220 is electrically shielded by the polysilicon film 6. As a result, the effects of the potentials of the adjacent semiconductor elements can be further prevented.

Note that the $n^+$-type semiconductor layers 16 formed on the polysilicon film 6 are conductive layers for ohmically connecting the electrodes 17. In this respect, $p^+$-type semiconductor layers can be formed instead of the $n^+$-type semiconductor layers 16.

The Fourth Embodiment

Figure 10:
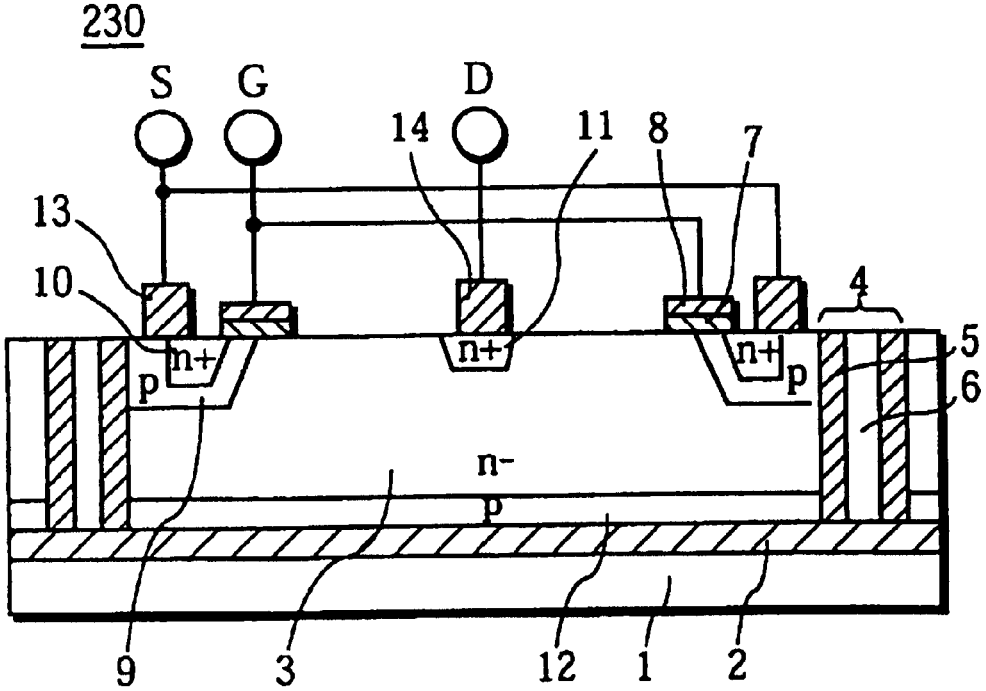
FIG. 10 is a sectional view of the main structure of an n-type high voltage MOS transistor according to the fourth embodiment of the present invention.

FIG. 10 is a sectional view of the main structure of an n-type high voltage MOS transistor 230 according to the fourth embodiment of the present invention. The n-type high voltage MOS transistor 230 is different from the n-type high voltage MOS transistor 200 in FIG. 3 in the places of the source electrodes 13 and the drain electrode 14. More specifically, the source electrodes 13 in the n-type high voltage MOS transistor 230 are formed in places corresponding to the place of the drain electrodes 14 in the n-type high voltage MOS transistor 200, and the drain electrode 14 in the n-type high voltage MOS transistor 230 is formed in a place corresponding to the place of the source electrode 13 in the n-type high voltage MOS transistor 200. For the n-type high voltage MOS transistor 230, the p-type semiconductor layers 9 for channel regions, the source electrodes 13, and the $n^+$-type semiconductor layers 10, which are formed so as to be connected to the source electrodes 13 and be surrounded by the p-type semiconductor layers 9, are formed on outer regions of the surface of the island $n^-$-type semiconductor layer 3. On the other hand, the drain electrode 14 and the $n^+$-type semiconductor layer 11 that is connected to the drain electrode 14 as the third semiconductor layer are formed at the center of the surface of the island $n^-$-type semiconductor layer 3. With this structure, an n-type high voltage MOS transistor with an improved reverse bias operating voltage can be realized as in the case of the n-type high voltage MOS transistor 200 in the first embodiment.

The Fifth Embodiment

Figure 11:
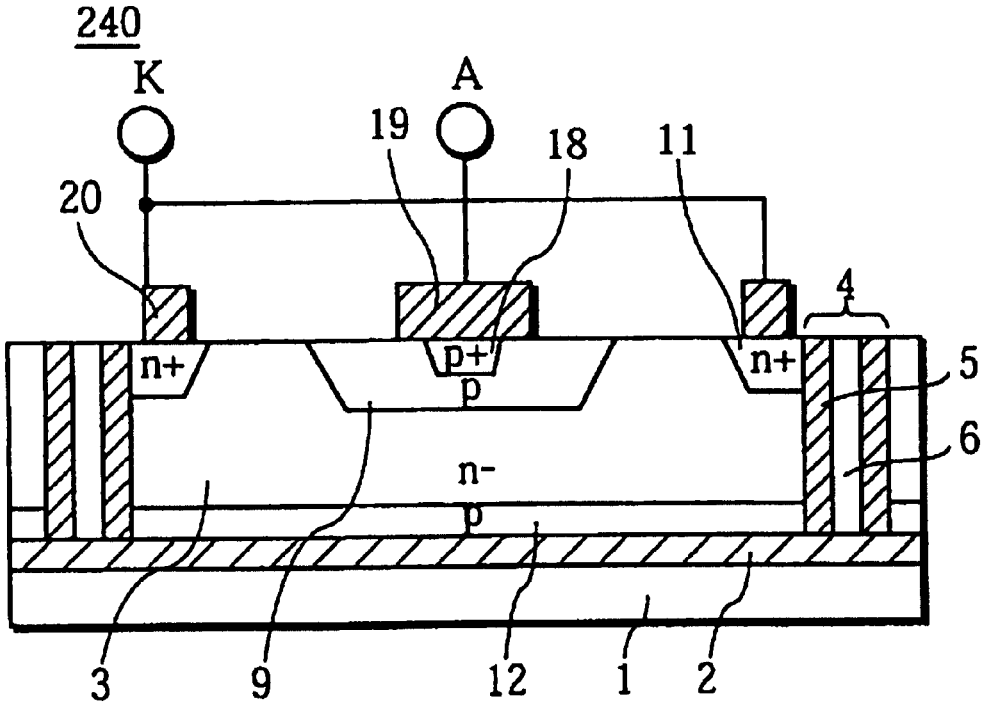
FIG. 11 is a sectional view of the main structure of a high voltage pn diode according to the fifth embodiment of the present invention.

FIG. 11 is a sectional view of the main structure of a high voltage pn diode 240 according to the fifth embodiment of the present invention. Unlike the n-type high voltage MOS transistor 200, the gate oxide film 7, the gate electrode 8, and the $n^+$-type semiconductor layers 10 that are formed so as to be connected to the gate electrodes 8 and to be surrounded by the p-type semiconductor layer 9 in FIG. 3 are not formed for the high voltage pn diode 240. For the high voltage pn diode 240, a $p^+$-type semiconductor layer 18 is formed so as to be surrounded by the p-type semiconductor layer 9 instead of the $n^+$-type semiconductor layers 10, an anode electrode 19 instead of the source electrode 13, and cathode electrodes 20 instead of the drain electrodes 14.

In the high voltage pn diode 240, the p-type semiconductor layer 9, the $n^+$-type semiconductor layers 11, the $n^-$-type semiconductor layer 3, and the p-type semiconductor layer 12 have the same structures as in the n-type high voltage MOS transistor 200 according to the first embodiment. As a result, the high voltage pn diode 240 has an improved reverse bias operating voltage.

The Sixth Embodiment

Figure 12:
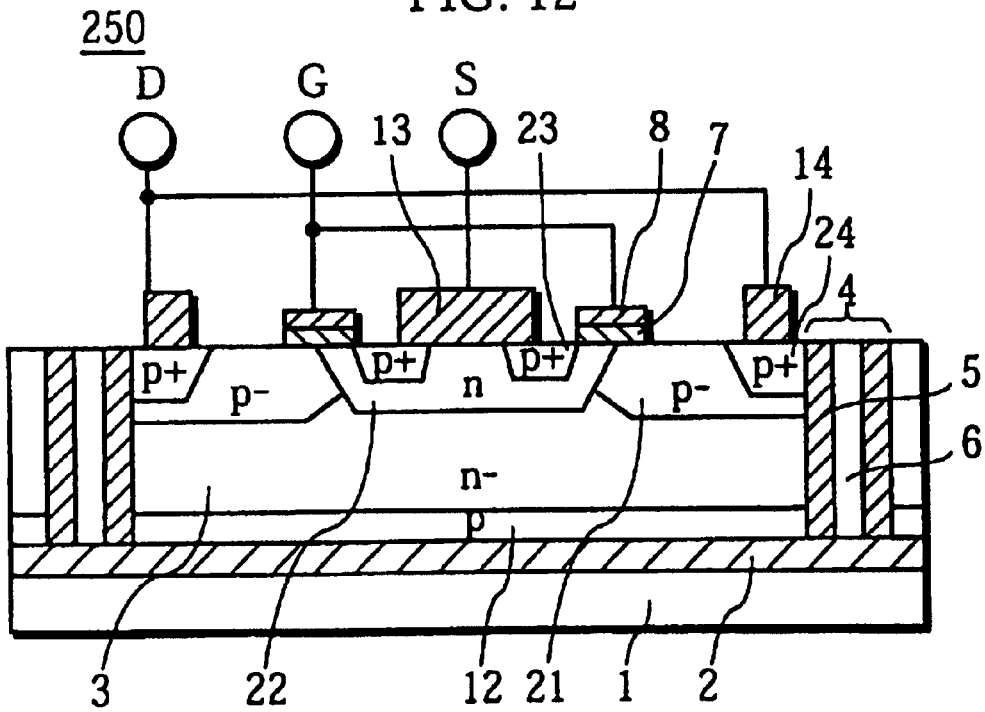
FIG. 12 is a sectional view of the main structure of a p-type high voltage MOS transistor according to the sixth embodiment of the present invention.

FIG. 12 is a sectional view of the main structure of a p-type high voltage MOS transistor 250 according to the sixth embodiment of the present invention. The island $n^-$-type semiconductor layer 3 in the p-type high voltage MOS transistor 250 is formed in the same manner as in the n-type high voltage MOS transistor 200. On the $n^-$-type semiconductor layer 3, the gate oxide films 7, the gate electrodes 8, an n-type semiconductor layer 22, the source electrode 13, $p^+$-type semiconductor layers 23, the drain electrodes 14, $p^+$-type semiconductor layers 24, and the $p^-$-type semiconductor layers 21 are formed. The n-type semiconductor layer 22 is formed as the third semiconductor layer for forming a channel region. The $p^+$-type semiconductor layers 23 are formed so as to be connected to the source electrode 13 and to be surrounded by $p^-$-type semiconductor layers 22. The $p^+$-type semiconductor layers 24 are formed as the second semiconductor layer connected to the drain electrodes 14. The $p^-$-type semiconductor layers 21 are formed so as to surround the $p^+$-type semiconductor layers 24 and so that a part of each of the $p^-$-type semiconductor layers 21 contacts the n-type semiconductor layer 22. At the interface between the island $n^-$-type semiconductor layer 3 and the silicon dioxide film 2, the p-type semiconductor layer 12 is formed as the fourth semiconductor layer.

In the p-type high voltage MOS transistor 250, the $p^-$-type semiconductor layers 21 and the $p^+$-type semiconductor layers 24, the n-type semiconductor layer 22, and the $p^+$-type semiconductor layers 23 are formed instead of the $n^+$-type semiconductor layers 11, the p-type semiconductor layer 9, and the $n^+$-type semiconductor layers 10 in the n-type high voltage MOS transistor 200 according to the first embodiment, respectively to have different conductivity types from the n-type high voltage MOS transistor 200. Apart from the conductivity types of the semiconductor layers, the p-type high voltage MOS transistor 250 has almost the same structure as the n-type high voltage MOS transistor 200. Also, the p-type high voltage MOS transistor 250 has an improved reverse bias operating voltage.

The Seventh Embodiment

Figure 13:
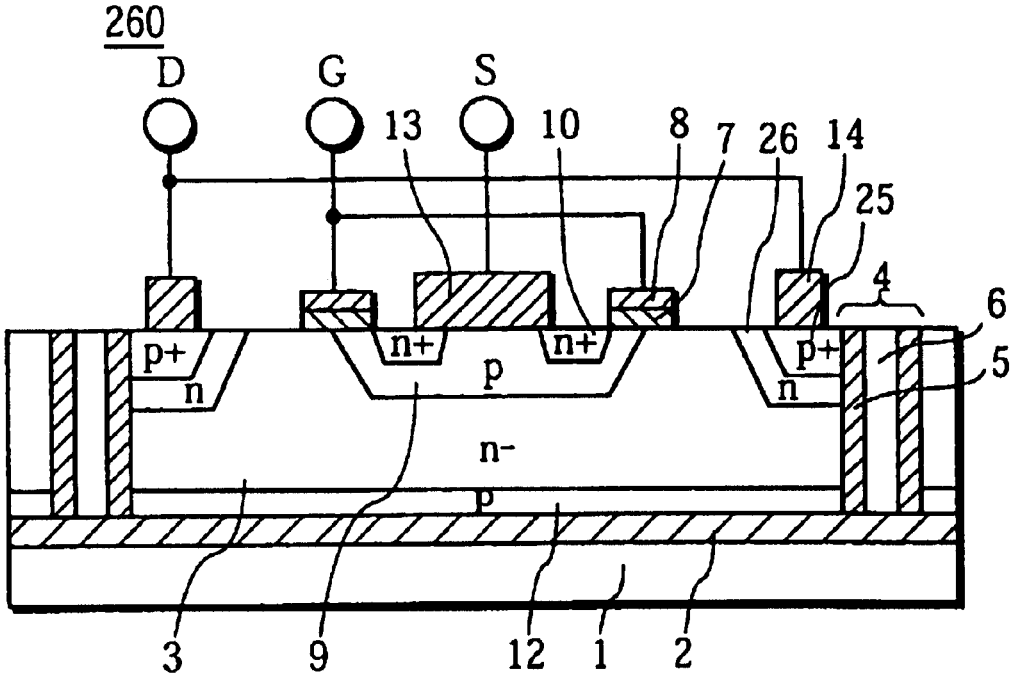
FIG. 13 is a sectional view of the main structure of a lateral IGBT according to the seventh embodiment of the present invention.

FIG. 13 is a sectional view of the main structure of a lateral insulated gate bipolar transistor (IGBT) 260 according to the seventh embodiment of the present invention. The island $n^-$-type semiconductor layer 3 in the lateral IGBT 260 is formed in the same manner as in the n-type high voltage MOS transistor 200. On the $n^-$-type semiconductor layer 3, the gate oxide films 7, the gate electrode 8, the p-type semiconductor layer 9, the source electrode 13, the $n^+$-type semiconductor layers 10, the drain electrodes 14, and n-type semiconductor layers 26 are formed. The p-type semiconductor layer 9 is formed as the second semiconductor layer for forming a channel region. The $n^+$-type semiconductor layers 10 are formed so as to be connected to the source electrode 13 and to be surrounded by the p-type semiconductor layer 9. The n-type semiconductor layers 26 are formed so as to surround $p^+$-type semiconductor layers 25 that are connected to the drain electrodes 14. At the interface between the island $n^-$-type semiconductor layer 3 and the silicon dioxide film 2, the p-type semiconductor layer 12 is formed as the fourth semiconductor layer. The basic structure of the pn diode consisting of the p-type semiconductor layer 9, the n-type semiconductor layers 26, and the $n^-$-type semiconductor layer 3 in the lateral IGBT 260 is the same as in the n-type high voltage MOS transistor 200 according to the first embodiment. Also, the same effects as the first embodiment can be obtained by the p-type semiconductor layer 12 at the bottom of the island $n^-$-type semiconductor layer 3. As a result, the lateral IGBT 260 also has an improved reverse bias operating voltage.

The Eighth Embodiment

Figure 14:
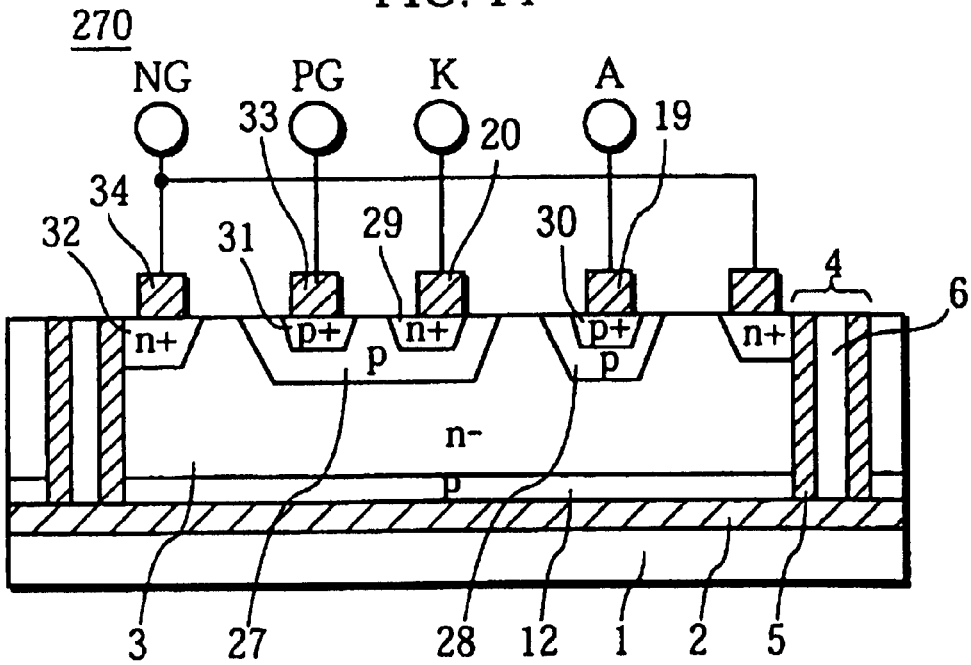
FIG. 14 is a sectional view of the main structure of a lateral thyristor according to the eighth embodiment of the present invention.

FIG. 14 is a sectional view of the main structure of a lateral thyristor 270 according to the eighth embodiment of the present invention. The island $n^-$-type semiconductor layer 3 in the lateral thyristor 270 is formed in the same manner as in the n-type high voltage MOS transistor 200. On the $n^-$-type semiconductor layer 3, p-type semiconductor layers 27 and 28, an anode electrode 19, a $p^+$-type semiconductor layer 30, a cathode electrode 20, an $n^+$-type semiconductor layer 29, a P-type control gate electrode 33, a $p^+$-type semiconductor layer 31, N-type control gate electrodes 34, and $n^+$-type semiconductor layers 32 are formed. The p-type semiconductor layers 27 and 28 are formed as the second semiconductor layer. The $p^+$-type semiconductor layer 30 is formed so as to be connected to the anode electrode 19 and to be surrounded by the p-type semiconductor layer 28. The $n^-$-type semiconductor layer 29 is formed so as to be connected to the cathode electrode 20 and to be surrounded by the p-type semiconductor layer 27. The $p^+$-type semiconductor layer 31 is formed so as to be connected to the P-type control gate electrode 33 and to be surrounded by the p-type semiconductor layer 27. The $n^+$-type semiconductor layers 32 are formed so as to be connected to the N-type control gate electrodes 34 as the third semiconductor layer.

At the interface between the island $n^-$-type semiconductor layer 3 and the silicon dioxide film 2, the p-type semiconductor layer 12 is formed as the fourth semiconductor layer. The lateral thyristor 270 has a pnpn structure consisting of the p-type semiconductor layer 28, the $n^-$-type semiconductor layer 3, the p-type semiconductor layer 27, and the $n^+$-type semiconductor layer 29. The basic operations by the pnpn structure is the same as the pn diode in the n-type high voltage MOS transistor 200. Also, the same effects as the first embodiment can be obtained by the p-type semiconductor layer 12 at the bottom of the island $n^-$-type semiconductor layer 3. As a result, the lateral thyristor 270 also has an improved reverse bias operating voltage.

(Other Possible Modifications)

The present invention is not limited to the preferred embodiments that have been described. Other possible modifications are given below.

(1) In the explanation of the preferred embodiments, the $n^-$-type semiconductor layer is used as the first semiconductor layer that is the active layer of the SOI substrate. The same effects can be obtained if the $p^-$-type semiconductor layer is used as the first semiconductor layer. In this case, however, the n-type semiconductor layer needs to be formed as the fourth semiconductor layer at the interface between the $p^-$-type semiconductor layer and the silicon dioxide film that has been embedded at the bottom of the first semiconductor layer.

(2) In the preferred embodiments, the semiconductor substrate 1 is used as the supporting substrate of the SOI substrate. The same effects can be obtained if an insulating substrate is used instead of the semiconductor substrate 1. In this case, however, it is preferable to set the potential on the underside of the SOI semiconductor device even by forming a metal film with a constant thickness on the back of the insulating substrate according to the evaporation, for instance. (3) In the preferred embodiments, the silicon dioxide film is used as the insulating film formed at the bottom of the $n^-$-type semiconductor layer 3 and the side walls of the isolation trench 4. The same effects can be obtained if another insulating film, for instance, the silicon nitride film is used instead of the silicon dioxide film.

Although the present invention has been fully described by way of examples with reference to the accompanying drawings, it is to be noted that various changes and modifications will be apparent to those skilled in the art. Therefore, unless such changes and modifications depart from the scope of the present invention, they should by construed as being included therein.

What is claimed is:

1. An SOI semiconductor device comprising:

a first semiconductor layer;

a second semiconductor layer that is formed on a first part of a first main surface of the first semiconductor layer;

a third semiconductor layer with a conductivity type different from a conductivity type of the second semiconductor layer, the third semiconductor layer being formed on a second part of the first main surface of the first semiconductor layer, the second part being separated from the first part;

a fourth semiconductor layer with a conductivity type different from a conductivity type of the first semiconductor layer, the fourth semiconductor layer being formed on a second main surface of the first semiconductor layer; and a first insulating layer that is formed on a main surface of the fourth semiconductor layer opposite to the first semiconductor layer, wherein the fourth semiconductor layer includes an impurity of an amount greater than $3\times10^{12}/cm^2$ which is not completely depleted even when a reverse bias voltage is applied between the second and third semiconductor layers, the reverse bias voltage making [a potential of a drain lower than a potential of a source] *a potential of a source lower than a potential of a drain*.

2. The SOI semiconductor device according to claim 1, wherein the amount of the impurity per unit area in the fourth semiconductor layer is larger than 1.5 times an amount of an impurity per unit area in the first semiconductor layer.

3. The SOI semiconductor device according to claim 1, wherein the first semiconductor layer includes $5\times10^{14}/cm^3$ to $1\times10^{15}/cm^3$ of an impurity.

4. The SOI semiconductor device according to claim 1, wherein an isolation trench is formed in an outer region of the first semiconductor layer so as to surround the second and third semiconductor layers and be deep enough to reach the first insulating layer, and a second insulating layer is formed on an side wall of the isolation trench.

5. The SOI semiconductor device according to claim 4, wherein a fifth semiconductor layer with the same conductivity type as the conductivity type of the fourth semiconductor layer is formed at an interface between the first semiconductor layer and the second insulating layer.

6. The SOI semiconductor device according to claim 5, wherein the fifth semiconductor layer includes more than $3\times10^{12}/cm^2$ of an impurity.

7. The SOI semiconductor device according to claim 5, wherein an amount of the impurity per unit area in the fifth semiconductor layer is larger than 1.5 times an amount of an impurity per unit area in the first semiconductor layer.

8. The SOI semiconductor device according to claim 4, wherein an interior space of the isolation trench is filled with an electrically conductive material.

9. The SOI semiconductor device according to claim 8, wherein the electrically conductive material is provided with an electrode.

10. The SOI semiconductor device according to claim 9, wherein the electrically conductive material is polysilicon, and the electrode is ohmically connected to the polysilicon via a conductive semiconductor layer.

11. The SOI semiconductor device according to claim 1, wherein a semiconductor substrate is joined to the fourth semiconductor layer at the main surface of the fourth semiconductor layer opposite to the first semiconductor layer, and the first insulating layer is an oxide film that has been formed on at least one of (1) the main surface of the fourth semiconductor layer opposite to the first semiconductor layer and (2) a surface of the semiconductor substrate at which the semiconductor substrate is joined to the fourth semiconductor layer.

12. The SOI semiconductor device according to claim 1, wherein the first insulating layer is an insulating substrate, and a metal film is formed on a main surface of the insulating substrate opposite to the fourth semiconductor layer.

13. The SOI semiconductor device according to claim 1, wherein the SOI semiconductor device is a MOS transistor.

14. The SOI semiconductor device according to claim 1, wherein the SOI semiconductor device is a pn diode.

15. The SOI semiconductor device according to claim 1, wherein the SOI semiconductor device is a lateral insulated gate bipolar transistor.

16. The SOI semiconductor device according to claim 1, wherein the SOI semiconductor device is a lateral thyristor.

17. An SOI semiconductor device comprising:

a first semiconductor layer;

a second semiconductor layer that is formed on a first part of a first main surface of the first semiconductor layer;

a third semiconductor layer with a conductivity type different from a conductivity type of the second semiconductor layer, the third semiconductor layer being formed on a second part of the first main surface of the first semiconductor layer, the second part being separated from the first part;

a fourth semiconductor layer with a conductivity type different from a conductivity type of the first semiconductor layer, the fourth semiconductor layer being formed on a second main surface of the first semiconductor layer;

a first insulating layer that is formed on a main surface of the fourth semiconductor layer opposite to the first semiconductor layer;

a source electrode, and a drain electrode wherein the fourth semiconductor layer includes an impurity of an amount that is large enough so as not to be completely depleted even when a reverse bias voltage is applied between the second and the third semiconductor layers, and the drain electrode is set at a potential [lower] *higher* than a potential of a source, the impurity amount is greater than $3\times10^{12}/cm^2$ and equal to or less than $1.0\times10^{17}/cm^2$.

18. The SOI semiconductor device according to claim 17 wherein the first semiconductor layer includes $5\times10^{14}/cm^3$ to $1\times10^{15}/cm^3$ of an impurity.

19. The SOI semiconductor device according to claim 18 wherein the amount of the impurity per unit area in the fourth semiconductor layer is larger than 1.5 times an amount of an impurity per unit area in the first semiconductor layer.

20. In a system for improving the operating voltage of a semiconductor device having means for applying voltages to the semiconductor device, the improvement of an SOI semiconductor device comprising:

a first semiconductor layer;

a second semiconductor layer that is formed on a first part of a first main surface of the first semiconductor layer;

a third semiconductor layer with a conductivity type different from a conductivity type of the second semiconductor layer, the third semiconductor layer being formed on a second part of the first main surface of the first semiconductor layer, the second part being separated from the first part;

a fourth semiconductor layer with a conductivity type different from a conductivity type of the first semiconductor layer, the fourth semiconductor layer being formed on a second main surface of the first semiconductor layer; and a first insulating layer that is formed on a main surface of the fourth semiconductor layer opposite to the first semiconductor layer, wherein the fourth semiconductor layer includes an impurity of an amount greater than $3\times10^{12}/cm^2$ which is not completely depleted even when a reverse-bias voltage is applied between the second and third semiconductor layers, the reverse bias voltage making [a potential of a drain lower than a potential of a source] *a potential of a source lower than a potential of a drain*.

* * * * *